(12) United States Patent
Morse et al.

(10) Patent No.: US 9,958,710 B1
(45) Date of Patent: May 1, 2018

(54) MULTI-CHANNEL LASER SYSTEM INCLUDING AN ACOUSTO-OPTIC MODULATOR (AOM) AND RELATED METHODS

(71) Applicant: Harris Corporation, Melbourne, FL (US)

(72) Inventors: Randall K. Morse, Palm Bay, FL (US); Peter A. Wasilousky, Indialantic, FL (US); Lee M. Burberry, West Melbourne, FL (US); Michael R. Lange, Melbourne, FL (US); Catheryn D. Logan, Melbourne, FL (US); Pat O. Bentley, West Melbourne, FL (US)

(73) Assignee: HARRIS CORPORATION, Melbourne, FL (US)

( * ) Notice: Subject to any disclaimer, the term of this patent is extended or adjusted under 35 U.S.C. 154(b) by 0 days. days.

(21) Appl. No.: 15/342,357

(22) Filed: Nov. 3, 2016

(51) Int. Cl.
| | |
|---|---|
| *G02F 3/00* | (2006.01) |
| *G02F 1/11* | (2006.01) |
| *G02B 27/10* | (2006.01) |
| *H03K 19/14* | (2006.01) |
| *H01S 3/10* | (2006.01) |
| *G02F 2/00* | (2006.01) |

(52) U.S. Cl.
CPC ............ *G02F 1/11* (2013.01); *G02B 27/1093* (2013.01); *G02F 1/113* (2013.01); *G02F 3/00* (2013.01); *G02F 2002/008* (2013.01); *H01S 3/10* (2013.01); *H03K 19/14* (2013.01)

(58) Field of Classification Search
CPC .. G02F 1/11; G02F 1/1113; G02F 3/02; G02F 3/022; G02F 3/026; G02F 2002/008; G02B 27/1093; H03K 19/14
USPC .......................... 359/107, 108, 239, 307, 372
See application file for complete search history.

(56) References Cited

U.S. PATENT DOCUMENTS

| | | |
|---|---|---|
| 3,731,231 A | 5/1973 | Torguet |
| 4,256,362 A | 3/1981 | Bardos |
| | (Continued) | |

FOREIGN PATENT DOCUMENTS

| | | |
|---|---|---|
| CA | 2484320 | 10/2005 |

OTHER PUBLICATIONS

U.S. Appl. No. 15/342,372; Filed Nov. 3, 2016.
(Continued)

*Primary Examiner* — Bumsuk Won
*Assistant Examiner* — Collin X Beatty
(74) *Attorney, Agent, or Firm* — Allen, Dyer, Doppelt & Gilchrist, P.A.

(57) ABSTRACT

A method may include generating a laser light beam with a laser source, splitting the laser light beam into a first front side beam and a back side beam for a back side of an ion trap using a first beamsplitter, directing the front side beam to a second beamsplitter using an input telescope, and splitting the first front side beam into a plurality of second front side beams directed to a common acousto-optic medium using a second beamsplitter. The common acousto-optic medium may have a respective plurality of electrodes coupled to the common acousto-optic medium for each of the second front side beams. The method may further include directing the plurality of second front side beams to a front side of the ion trap using an output telescope, and generating a respective RF drive signal for each of the plurality of electrodes using a plurality of RF drivers.

20 Claims, 5 Drawing Sheets

(56) References Cited

U.S. PATENT DOCUMENTS

| | | | |
|---|---|---|---|
| 4,956,650 | A | 9/1990 | Allen et al. |
| 5,363,363 | A | 11/1994 | Gage |
| 5,373,385 | A | 12/1994 | Darcie et al. |
| 5,386,221 | A | 1/1995 | Allen et al. |
| 5,631,762 | A | 5/1997 | Kataoka |
| 5,923,460 | A | 7/1999 | Stewart et al. |
| 6,320,989 | B1 | 11/2001 | Montgomery et al. |
| 6,487,324 | B2 | 11/2002 | Montgomery et al. |
| 6,538,690 | B1 | 3/2003 | Montgomery et al. |
| 6,621,511 | B2 | 9/2003 | Shibayama et al. |
| 6,765,709 | B1 | 7/2004 | Montgomery et al. |
| 6,870,658 | B2 | 3/2005 | Wasilousky |
| 7,126,106 | B2 * | 10/2006 | Goto .................. B82Y 10/00 250/214 R |
| 7,538,929 | B2 | 5/2009 | Wasilousky |
| 7,667,882 | B2 | 2/2010 | Adibi et al. |
| 7,791,052 | B2 * | 9/2010 | Ichimura ............. G06N 99/002 250/207 |
| 7,826,115 | B2 * | 11/2010 | Goto .................. G06N 99/002 359/108 |
| 7,920,265 | B1 | 4/2011 | George |
| 8,442,373 | B2 | 5/2013 | Hartl et al. |
| 2008/0291946 | A1 * | 11/2008 | Malinovsky ........... G02F 3/026 372/8 |
| 2009/0116009 | A1 * | 5/2009 | Nelson ................. G01J 3/02 356/326 |
| 2014/0050235 | A1 * | 2/2014 | Clowes ................ G02F 1/365 372/6 |

OTHER PUBLICATIONS

U.S. Appl. No. 15/342,350; Filed Nov. 3, 2016.

Nadlinger, David "Laser Intensity Stabilization and Pulse Shaping for Trapped-Ion Experiments using Acousto-Optic Modulators" Thesis; Physicds BSc Semester Project: Fall Semester 2013 with the Trapped Ion Quantum Information Group ETH Zurich. http://www.tiqi.ethz.ch/publications-and-awards/semester-theses.html: pp. 45.

Ye et al. "Delivery of high-stability optical and microwave frequency standards over an optical fiber network" https://www.osapublishing.org/josab/abstract.cfm?URI=josab-20-7-1459; Journal of the Optical Society of America B vol. 20, Issue 7, pp. 1459-1467 (2003) Abstract Only.

Fuller et al. "Experimental Implementations of Two-Dimensional Fourier Transform Electronic Spectroscopy" http://www.annualreviews.org/doi/abs/10.1146/annurev-physchem-040513-103623: Annual Review of Physical Chemistry vol. 66: 667-690 (Volume publication date Apr. 2015) Abstract Only.

A. Gh. Podoleanu, "Optical coherence tomography" http://onlinelibrary.wiley.com/doi/10.1111/j.1365-2818.2012.03619.x/pdf: Journal of Microscopy, 2012 Received Oct. 18, 2011; accepted Mar. 9, 2012: pp. 11.

Slater, Dan "Passive long range acousto-optic sensor" SPIE 6304, Free-Space Laser Communications VI, 63040E (Sep. 1, 2006); Abstract Only.

* cited by examiner

MULTI-CHANNEL LASER SYSTEM INCLUDING AN ACOUSTO-OPTIC MODULATOR (AOM) AND RELATED METHODS

TECHNICAL FIELD

The present invention relates to the field of optical devices, and, more particularly, to acousto-optic modulators for lasers and related methods.

BACKGROUND

Acousto-optic modulators, sometimes referred to as Bragg cells, diffract and shift light using sound waves at radio frequency. These devices are often used for Q-switching, signal modulation in telecommunications systems, laser scanning and beam intensity control, frequency shifting, and wavelength filtering in spectroscopy systems. Many other applications lend themselves to using acousto-optic devices.

In such acousto-optic devices, a piezoelectric transducer, sometimes also referred to as an RF transducer, is secured to an acousto-optic bulk medium as a transparent optical material, for example, fused silica, quartz or similar glass material. An electric RF signal oscillates and drives the transducer to vibrate and create sound waves within the transparent medium which effect the properties of an optical field in the medium via the photo elastic effect, in which a modulating strain field of an ultrasonic wave is coupled to an index of refraction for the acousto-optic bulk medium. As a result, the refractive index change in amplitude is proportional to that of sound.

The index of refraction is changed by moving periodic planes of expansion and compression in the acousto-optic bulk material. Incoming light scatters because of the resulting periodic index modulation and interference, similar to Bragg diffraction.

Acousto-optic modulators are preferred in many applications because they are faster than tiltable mirrors and other mechanical devices. The time it takes for the acousto-optic modulator to shift an exiting optical beam is limited to the transit time of the sound wave. The acousto-optic modulators are often used in Q-switches where a laser produces a pulsed output beam at high peak power, typically in the Kilowatt range. This output could be higher than lasers operating a continuous wave (CW) or constant output mode.

Examples of acousto-optic modulator devices and similar acousto-optic systems are disclosed in commonly assigned U.S. Pat. Nos. 4,256,362; 5,923,460; 6,320,989; 6,487,324; 6,538,690; 6,765,709; and 6,870,658, the disclosures of which are hereby incorporated by reference in their entireties.

Some applications using acousto-optic devices modulate the intensity of an optical beam. This modulation may create small deviations in the output angle of the diffracted beam because of the local thermal transients introduced when the RF modulation waveform to the device is turned ON and OFF. These thermal transients may negatively impact the resolution and location of the focused spot, which may be produced. One advantageous approach which may be used to help enhance the resolution of acousto-optic devices is set forth in U.S. Pat. No. 7,538,929 to Wasilousky, which is assigned to the present Applicant and is hereby incorporated herein in its entirety by reference. Wasilousky discloses an acousto-optic modulator which includes an acousto-optic bulk medium and transducer attached to the acousto-optic bulk medium and famed as a linear array of electrodes. A transducer driver is connected to each electrode and is coherently phase driven to alter the angular momentum distribution of an acoustic field and alternately allow and inhibit phase matching between the optical and acoustic field and produce a desired intensity modulation of an optical wavefront.

Despite the existence of such configurations, further advancements in laser systems using acousto-optic modulators may be desirable in certain applications.

SUMMARY

A laser system may include a laser source configured to generate a laser light beam, an ion trap, a first beamsplitter configured to split the laser light beam into a first front side laser light beam and a back side laser light beam for a back side of the ion trap, and a multi-channel acousto-optic modulator (AOM). The multi-channel AOM may include a second beamsplitter to split the first front side laser light beam into a plurality of second front side laser light beams from the second beamsplitter, a common acousto-optic medium configured to receive the plurality of front side laser light beams, and a respective plurality of electrodes coupled to the common acousto-optic medium for each of the second front side laser light beams. The system may further include a plurality of radio frequency (RF) drivers each configured to generate an RF drive signals for each of the plurality of electrodes, an input telescope configured to direct the front side laser light beam to the second beamsplitter, and an output telescope configured to direct the plurality of second front side laser light beams to a front side of the ion trap.

More particularly, the laser system may further include at least one turning mirror to direct the back side laser light beam from the first beamsplitter to the back side of the workpiece. Also, a single-channel AOM may be positioned in the light path of the back side laser light beam between the beamsplitter and the workpiece. Furthermore, a single channel amplitude leveling AOM may be coupled between the laser source and the first beamsplitter.

In accordance with one example embodiment, the electrodes may comprise phased array transducer electrodes, and each RF driver may be configured to drive alternating electrodes of the respective array transducer electrodes with different phases. More particularly, each RF driver may be configured to drive the alternating electrodes with different phases within a range of 0° to 180°. By way of example, an RF power level associated with each RF drive signal may have a constant power. By way of example, the second beamsplitter may comprise a high efficiency diffractive optical element (DOE) and a set of telecentric beam forming optics associated therewith.

A related method may include generating a laser light beam with a laser source, splitting the laser light beam into a first front side laser light beam and a back side laser light beam for a back side of an ion trap using a first beamsplitter, directing the front side laser light beam to a second beamsplitter using an input telescope, and splitting the first front side laser light beam into a plurality of second front side laser light beams directed to a common acousto-optic medium using a second beamsplitter. A respective plurality of electrodes may be coupled to the common acousto-optic medium for each of the second front side laser light beams. The method may further include directing the plurality of second front side laser light beams to a front side of the ion trap using an output telescope, and generating respective RF drive signals for the electrodes using a plurality of RF drivers.

DETAILED DESCRIPTION OF THE EMBODIMENTS

By way of background, excessive noise levels from laser sources in optical illumination systems generate instabilities and errors. In particular, systems that manipulate the quantum states of particles, atoms and electrons, typically require extreme stability. Beam pointing errors correlate to noise in quantum state manipulation systems. Moreover, beam pointing stability due to thermal transients in the bulk material of active acousto-optic devices in an optical illumination system affect many applications, but especially those designed for quantum state illumination.

Figure 1:
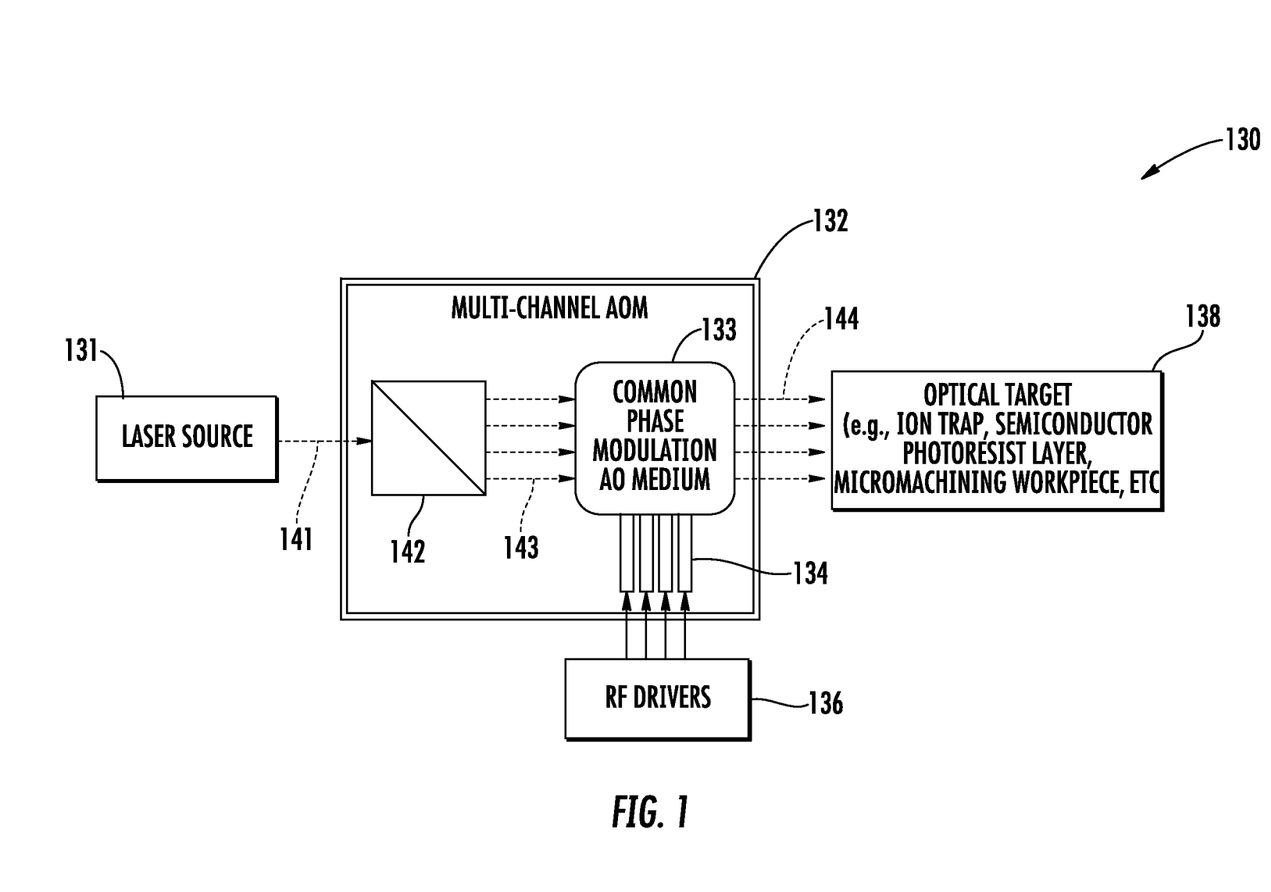
FIG. 1 is a schematic block diagram of a laser system including a multi-channel acousto-optic modulator (AOM) in accordance with an example embodiment.
Figure 5:
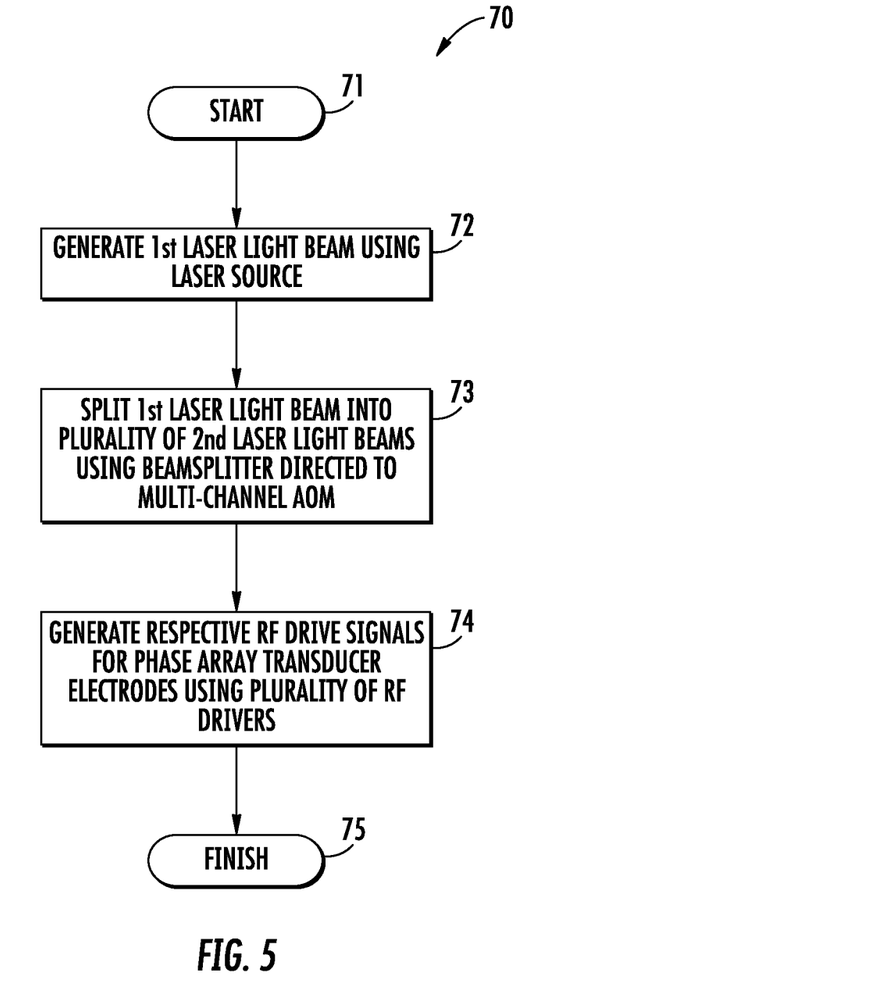
FIGS. 5-6 are flow diagrams illustrating method aspects associated with the systems of FIGS. 1-2, respectively.

Turning initially to FIG. 1 and the flow diagram 70 of FIG. 5, a laser system 130 which provides multi-channel operation and associated method aspects are now described. By way of background, typical multi-channel acousto-optic (AO) devices suffer from excessive beam pointing errors due to data dependent thermal transients generated in the ultrasonic transducer and bulk optical substrate material. Moreover, beam pointing errors correlate to noise in quantum state manipulation systems. In addition, inter-channel acoustic crosstalk is a major source of data dependent variation in the modulated optical beam intensity.

Current passive approaches may minimize the magnitude of beam deflection due to thermal transients generated when channel data is switched on and off (i.e., no auxiliary heating electrodes). This reduces the magnitude of the time average thermal gradients produced by the aggregate array during normal operation, leading to reductions in polarization corruption and gross beam offset. In addition, it does not address beam intensity fluctuations produced by inter-channel acoustic strain field interaction.

Beginning at Block 71, the multi-channel system 130 illustratively includes a laser source 131 which generates a first laser light beam 141, at Block 72. In accordance with one example embodiment, a Paladin Advanced 355 nm mode locked UV laser source from Coherent, Inc. of Santa Clara, Calif. may be used, although other suitable laser sources may also be used in different embodiments. A diffractive/refractive beam splitter 142 divides the first laser light beam 141 into a plurality of second laser light beams 143, at Block 73, which in the illustrated example is four, although other numbers of beams (e.g., 8, 32, etc.) may be used depending upon the given application. The second laser light beams 143 are received by a common phase modulation acousto-optic medium 133 of a multi-channel AOM 132. That is, the acousto-optic medium 133 is common to all of the second laser light beams, i.e., the same acousto-optic medium is used to modulate each of the second laser light beams. The acousto-optic medium 133 may include a piezoelectric transducer and bulk acousto-optic medium (e.g., silica, quartz, glass, etc.), as discussed above. However, it should be noted that the phase-capable multi-channel AOM 132 need not be used in all embodiments, and that an amplitude modulation AOM may instead by used in other configurations, for example.

The AOM 132 further includes multiple transducers, each comprising respective electrodes 134, for each of the second laser light beams 143 coupled to the common acousto-optic medium 133. The laser system 130 further illustratively includes a plurality of RF drivers 136 each configured to generate the requisite RF drive signals for their respective phased array transducer electrodes 134, at Block 74, which illustratively concludes the method of FIG. 7 (Block 75).

Figure 3:
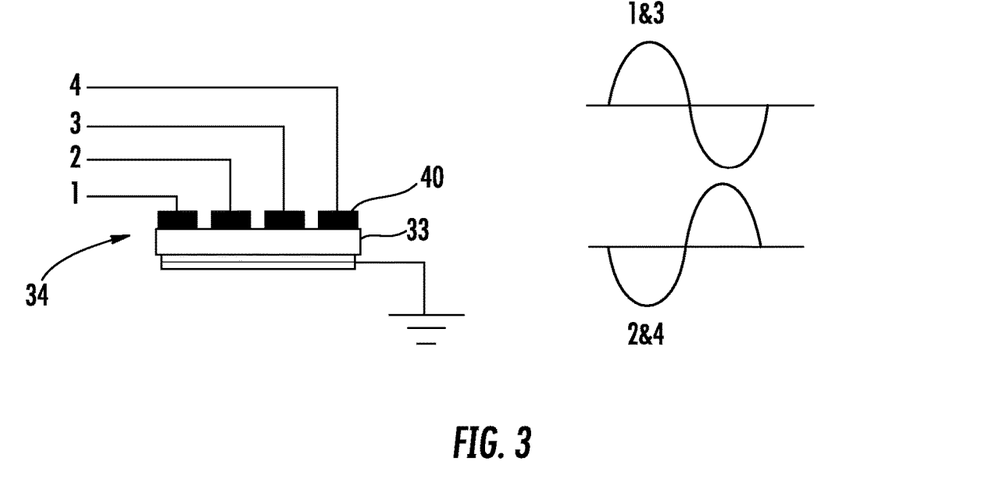
FIGS. 3 and 4 are schematic circuit diagrams illustrating different electrode connection configurations and associated driving signals therefor which may be used with the systems of FIGS. 1-2.
Figure 4:
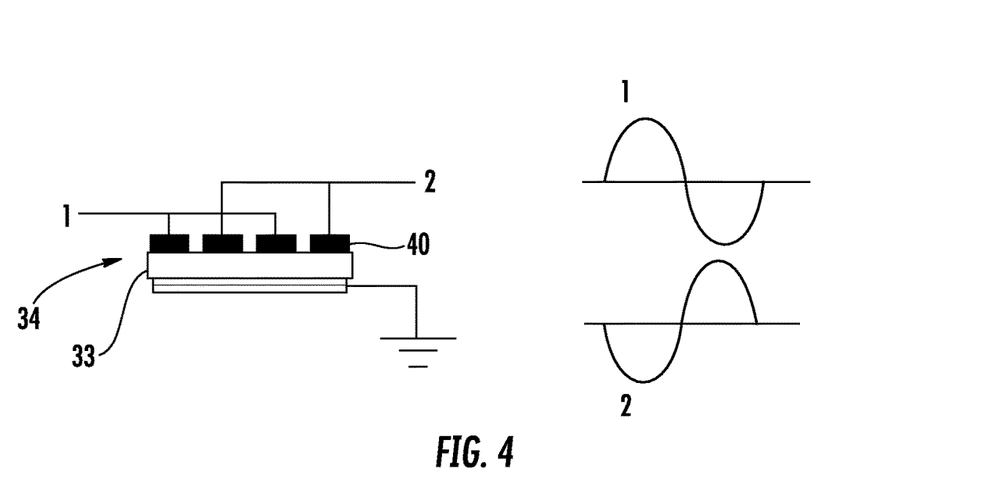

Referring additionally to FIGS. 3 and 4, each RF driver 136 may be configured to drive alternating electrodes of the respective array of transducer electrodes 134 with different phases. More particularly, two example configurations for driving alternating electrodes 40 of the array of transducer electrodes 34 with different phases are now described. In the first configuration (FIG. 3), the first and third driving signals (shown on the right hand side of FIG. 3) provided to corresponding odd numbered electrodes are 180° out of phase with the second and fourth driving signals provided to corresponding even numbered electrodes. In the second configuration (FIG. 4), first and second drive signals are respectively connected to odd and even electrodes in an interdigitated fashion as shown, and as before these drive signals are 180° out of phase to one another. In this way, directly adjacent electrodes are driven at opposite phases to one another. However, it should be noted that the RF drive signals need not always be 180° out of phase, i.e., they may be somewhere between 0° and 180° to vary the level of phase matching occurring in the AO diffraction process.

Such a bi-phase configuration helps to eliminate beam deflection due to thermal transients generated when channel data is switched on and off, i.e., by using phase modulation only. More particularly, a bi-phase approach maintains the RF Signal "ON" and only flips the phase of the drive signal to alternating elements, as opposed to a conventional amplitude modulation approach in which optical modulation is achieved by turning the RF signal "ON" and "OFF".

The present approach may accordingly reduce time average thermal gradients produced by the aggregate array during normal operation since the RF power level is essentially constant or stationary, which helps to minimize polarization corruption and gross beam offset. This further helps to reduce beam intensity fluctuations produced by inter-channel acoustic crosstalk by minimizing changes in the adjacent channel strain field due to changes in local channel data.

By way of example, the transducer electrodes 134 may be implemented as metalizations on the piezoelectric AO medium 133, which are spaced apart 500 µm or less at their centers, and more particularly 450 µm or less. However, other dimensions may be used in different embodiments.

Accordingly, employing a phase modulation capable acousto-optic modulator or transducer structure in a multi-channel device configuration provides significant advantages. More particularly, phase modulation used with pulse code (ON/OFF) modulation provides inherently better pointing stability, since the RF power applied to the device remains substantially constant at all times, even during data input bit transitions. Moreover, the effects of inter-channel acoustic crosstalk are reduced since the integrated optical effect resulting from changes in the localized strain field due to adjacent transducer operation are reduced. This technique may be particularly appropriate when reduced "ON/OFF" contrast is acceptable, e.g., mask generation involving photoresist. However, in addition to a photoresist layer of a semiconductor device, other optical targets 138 may also be used with the system 130, such as an ion trap(s), micromachining workpiece, etc.

Figure 2:
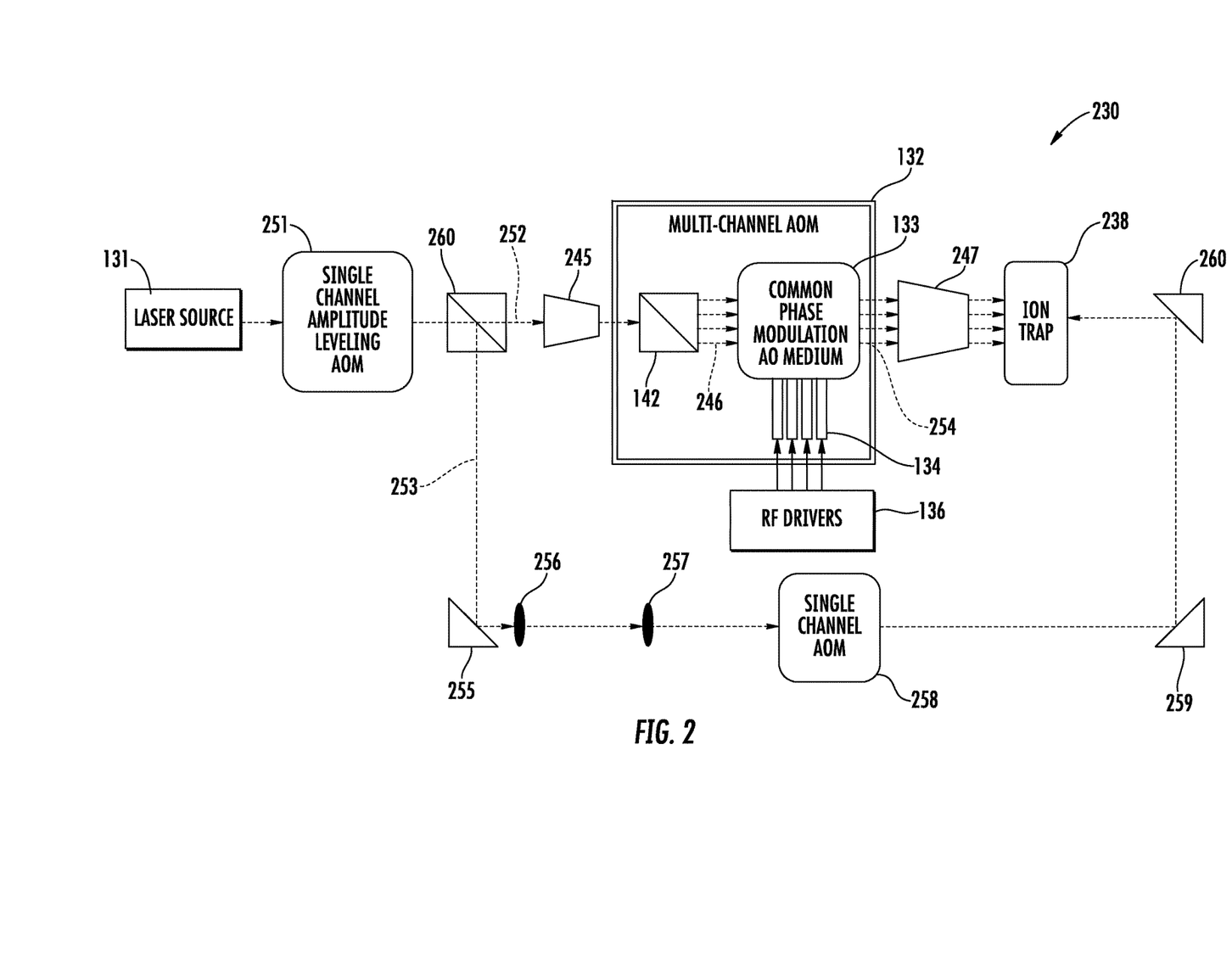
FIG. 2 is a schematic block diagram of a laser system for use with an ion trap including a multi-channel AOM in accordance with an example embodiment.
Figure 6:
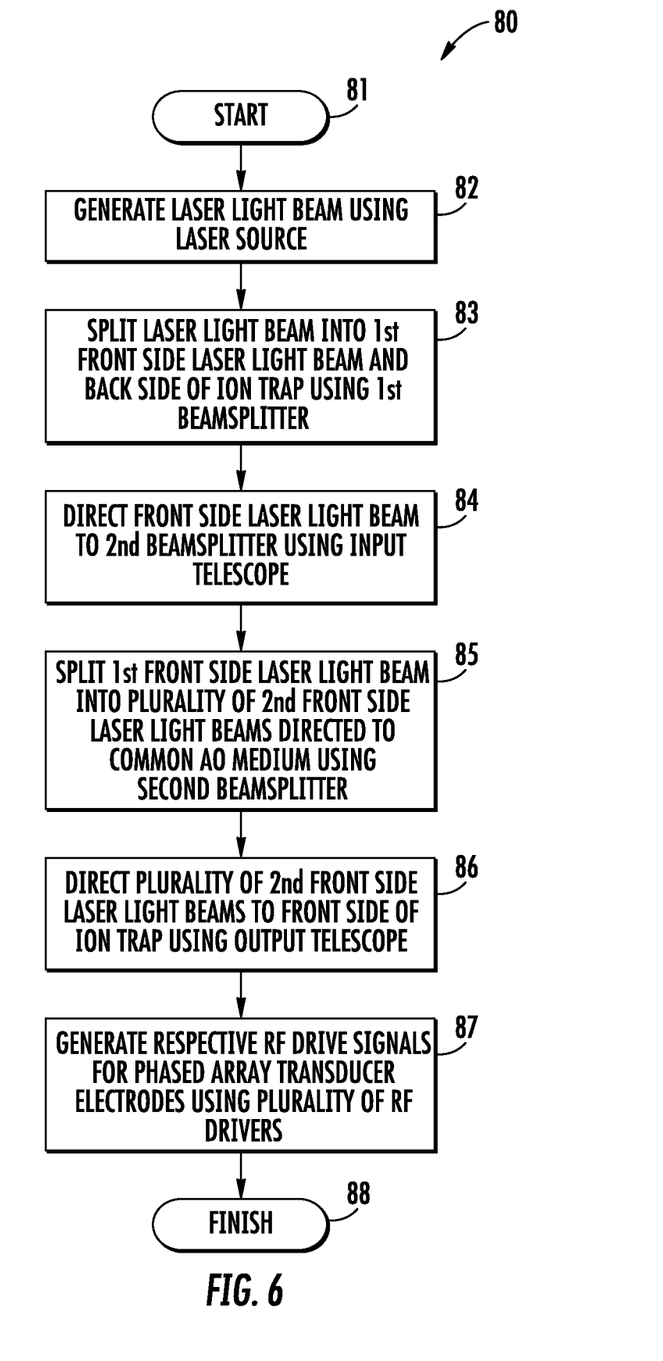

Turning now to FIG. 2 and the flow diagram 80 of FIG. 6, a multi-channel laser system 230 which may incorporate the multi-channel AOM 132 described above, or alternately an array of conventional transducers, for quantum state applications is now described. By way of background, quantum state manipulation illumination systems control both the optical amplitude and phase in an interferometric application. However, this requires significant improvements in crosstalk and beam pointing stability.

Beginning at Block 81, the system 230 illustratively includes a laser source 231, such as those described above, which is configured to generate a laser light beam (Block 82). The output of the laser source 231 may optionally be provided to a single channel amplitude leveling AOM 251, which helps reduce noise from the laser source. The output of the AOM 251 is split into a first front side laser light beam 252 and a back side laser light beam 253 for a back side of an ion trap 238 by a beamsplitter 260, at Block 83. The front side laser light beam 252 passes through an input telescope 245 to the multi-channel AOM 132, at Block 84. As noted above, the AOM 132 includes the diffractive/refractive beamsplitter 142 or diffractive optical element (DOE) to split the front side laser light beam 252 into a plurality of front side laser light beams 246, at Block 85. In the illustrated example, four such beams are shown, but in other embodiments different numbers of beams may be used, as noted above. Additional beam forming optics between the beamsplitter 142 and the common AO medium 133 are incorporated to allow telecentric beam positioning and adjustment of individual beam waist dimensions along the centerline and midpoint of each transducer.

The modulated front side laser light beams 254 output by the AOM 132 are passed through an output telescope 247 and directed to the front side of an ion trap 238, at Block 86. The back side laser light beam 253 is directed to a first turning mirror 255, and then through first and second focusing optics 256, 257 (although different numbers of optical focusing stages may be used in different embodiments) to a single channel AOM 258. The output of the single channel AOM 258 is directed by turning mirrors 259 and 260 to the back side of the ion trap 238 in the example implementation. Furthermore, respective RF drive signals are generated for the phased array transducer electrodes 134 using the plurality of RF drivers 136, at Block 87, as similarly described above, or using simplified drive signals when conventional transducers are employed. The method of FIG. 6 illustratively concludes at Block 88.

In accordance with one example implementation, an integrated multi-channel AOM assembly 132 may be provided including a high efficiency DOE or beamsplitter 142, a set of telecentric beam forming optics, a thermally compensated N channel AOM including the common AO medium 133 and in one embodiment transducers employing an array of phased electrodes 134, and in certain applications, a counter propagating illumination beam. As noted above, the input beam may be split into N separate optical beams, each of which may be independently modulated in phase and amplitude, with a frequency shift on the first order diffracted beam equal to the acoustic frequency. The resultant individual beam pointing stability is not only suitable for precision photolithography tools, but also addressing applications such as illuminating atoms in an ion trap architecture quantum computer, micro-machining and 3D printing, for example.

A highly engineered integrated module approach may be used to achieve the highly uniform, stable, low cross-talk multi-channel beam illumination system needed for high precision manipulation of quantum states of individual atoms. This integrated module approach may be used at various interaction wavelengths. It should be noted that the noise diverting approach using the first order beam as a noise dump described above with respect to FIG. 1 may also be employed in the systems 130 and 230 in some embodiments, if desired.

In one or more of the foregoing embodiments, separate active heating elements may be included to help improve performance, if desired. One such configuration is set forth in U.S. Pat. No. 6,765,709 to Montgomery et al., which is assigned to the present Assignee and is hereby incorporated herein in its entirety by reference. Furthermore, additional techniques may also be employed for noise reduction in some embodiments, such as described in the co-pending applications: U.S. patent application Ser. No. 15/342,372 filed Nov. 3, 2016, entitled CONTROL SYSTEM USING A PHASE MODULATION CAPABLE ACOUSTO-OPTIC MODULATOR FOR DIVERTING LASER OUTPUT INTENSITY NOISE TO A FIRST ORDER LASER LIGHT BEAM AND RELATED METHODS; and U.S. patent application Ser. No. 15/342,350 filed Nov. 3, 2016, entitled MULTI-CHANNEL ACOUSTO-OPTIC MODULATOR (AOM) AND RELATED METHODS. Both of these applications are assigned to the present Applicant Harris Corporation and are hereby incorporated herein in their entireties by reference.

Many modifications and other embodiments will come to the mind of one skilled in the art having the benefit of the teachings presented in the foregoing descriptions and the associated drawings. Therefore, it is understood that the disclosure is not to be limited to the specific embodiments disclosed, and that modifications and embodiments are intended to be included within the scope of the appended claims.

That which is claimed is:

1. A laser system comprising:
   a laser source configured to generate a laser light beam;
   an ion trap;
   a first beamsplitter configured to split the laser light beam into a first front side laser light beam and a back side laser light beam for a back side of the ion trap;
   a multi-channel acousto-optic modulator (AOM) comprising
       a second beamsplitter to split the first front side laser light beam into a plurality of second front side laser light beams from the second beamsplitter,
       a common acousto-optic medium configured to receive the plurality of front side laser light beams, and
       a respective plurality of electrodes coupled to the common acousto-optic medium for each of the second front side laser light beams;
   a plurality of radio frequency (RF) drivers each configured to generate respective RF drive signals for each of the plurality of electrodes;
   an input telescope configured to direct the front side laser light beam to the second beamsplitter; and an output telescope configured to direct the plurality of second front side laser light beams to a front side of the ion trap.

2. The laser system of claim 1 further comprising at least one turning mirror to direct the back side laser light beam from the first beamsplitter to the back side of the workpiece.

3. The laser system of claim 1 further comprising a single-channel AOM positioned in the light path of the back side laser light beam between the beamsplitter and the workpiece.

4. The laser system of claim 1 further comprising a single channel amplitude leveling AOM coupled between the laser source and the first beamsplitter.

5. The laser system of claim 1 wherein the electrodes comprise phased array transducer electrodes; and wherein each RF driver is configured to drive alternating electrodes of the respective phased array transducer electrodes with different phases.

6. The laser system of claim 5 wherein each RF driver is configured to drive the alternating electrodes with different phases within a range of 0° to 180°.

7. The laser system of claim 5 wherein an RF power level associated with each RF drive signal has a constant power.

8. The laser system of claim 1 wherein the second beamsplitter comprises a high efficiency diffractive optical element (DOE) and a set of telecentric beam forming optics associated therewith.

9. A laser system comprising:
a laser source configured to generate a laser light beam;
an ion trap;
a first beamsplitter configured to split the laser light beam into a first front side laser light beam and a back side laser light beam for a back side of the ion trap;
a multi-channel acousto-optic modulator (AOM) comprising
    a second beamsplitter to split the first front side laser light beam into a plurality of second front side laser light beams from the second beamsplitter, the second beamsplitter comprising a high efficiency diffractive optical element (DOE) and a set of telecentric beam forming optics associated therewith,
    a common acousto-optic medium configured to receive the plurality of front side laser light beams, and
    a respective plurality of electrodes coupled to the common acousto-optic medium for each of the second front side laser light beams;
a plurality of radio frequency (RF) drivers configured to generate respective RF drive signals for each of the plurality of electrodes;
an input telescope configured to direct the front side laser light beam to the second beamsplitter;
an output telescope configured to direct the plurality of second front side laser light beams to a front side of the ion trap;
at least one turning mirror to direct the back side laser light beam from the first beamsplitter to the back side of the ion trap; and
a single-channel AOM positioned in the light path of the back side laser light beam between the beamsplitter and the ion trap.

10. The laser system of claim 9 further comprising a single channel amplitude leveling AOM coupled between the laser source and the first beamsplitter.

11. The laser system of claim 9 wherein the electrodes comprise phased array transducer electrodes; and wherein each RF driver is configured to drive alternating electrodes of the respective phased array transducer electrodes with different phases.

12. The laser system of claim 11 wherein each RF driver is configured drive the alternating electrodes with different phases within a range of 0° to 180°.

13. The laser system of claim 11 wherein an RF power level associated with each RF drive signal has a constant power within ±0.1%.

14. A method comprising:
generating a laser light beam with a laser source;
splitting the laser light beam into a first front side laser light beam and a back side laser light beam for a back side of an ion trap using a first beamsplitter;
directing the front side laser light beam to a second beamsplitter using an input telescope; and
splitting the first front side laser light beam into a plurality of second front side laser light beams directed to a common acousto-optic medium using a second beamsplitter, wherein a respective plurality of electrodes is coupled to the acousto-optic medium for each of the second front side laser light beams;
directing the plurality of second front side laser light beams to a front side of the ion trap using an output telescope; and
generating respective RF drive signals for each of the plurality of electrodes using a plurality of radio frequency (RF) drivers.

15. The method of claim 14 further comprising directing the back side laser light beam from the first beamsplitter to the back side of the ion trap using at least one turning mirror.

16. The method of claim 14 wherein a single-channel acousto-optic modulator (AOM) is positioned in the light path of the back side laser light beam between the beamsplitter and the workpiece.

17. The method of claim 14 wherein a single-channel amplitude leveling acousto-optic modulator (AOM) is coupled between the laser source and the first beamsplitter.

18. The method of claim 14 wherein the electrodes comprise phased array transducer electrodes; and wherein generating the respective RF drive signals comprises generating the respective RF drive signal to drive alternating electrodes of respective phased array transducer electrodes with different phases.

19. The method of claim 18 wherein each drive signal is configured to drive the alternating electrodes with different phases within a range of 0° to 180°.

20. The method of claim 18 wherein an RF power level associated with each RF drive signal has a constant power.

* * * * *